(12) United States Patent
Fujita (10) Patent No.: US 7,663,941 B2
(45) Date of Patent: Feb. 16, 2010

(54) SEMICONDUCTOR MEMORY DEVICE

(75) Inventor: Katsuyuki Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 12/034,985

(22) Filed: Feb. 21, 2008

(65) Prior Publication Data

US 2008/0212377 A1 Sep. 4, 2008

(30) Foreign Application Priority Data

Feb. 22, 2007 (JP) ............... 2007-042190

(51) Int. Cl.
*G11C 7/00* (2006.01)
(52) U.S. Cl. ................. 365/189.11; 365/207
(58) Field of Classification Search ............ 365/189.11, 365/207, 189.05
See application file for complete search history.

(56) References Cited

U.S. PATENT DOCUMENTS

| | | | |
|---|---|---|---|
| 6,567,330 B2 | 5/2003 | Fujita et al. | |
| 7,277,341 B2 | 10/2007 | Fujita et al. | |
| 7,301,838 B2 * | 11/2007 | Waller et al. | ............ 365/205 |
| 7,539,043 B2 * | 5/2009 | Ohsawa | ............ 365/149 |
| 2007/0279979 A1 | 12/2007 | Fujita | |
| 2008/0198673 A1 | 8/2008 | Fujita | |

FOREIGN PATENT DOCUMENTS

JP 2005-302234 10/2005

OTHER PUBLICATIONS

Takashi Ohsawa, et al., "An 18.5ns 128Mb SOI DRAM with a Floating Body Cell", 2005 IEEE International Solid-State Circuits Conference, Digest of Technical Papers, vol. 48, 2005, 5 pages.

* cited by examiner

*Primary Examiner*—Anh Phung
(74) *Attorney, Agent, or Firm*—Oblon, Spivak, McClelland, Maier & Neustadt, L.L.P.

(57) ABSTRACT

This disclosure concerns a semiconductor memory device comprising memory cells including floating bodies storing data; word lines connected to gates of the memory cells; a pair of bit lines connected to the memory cells, and transmitting data of the memory cells; a pair of sense nodes connected to the bit lines, and transmitting the data of the memory cells; transfer gates connected between the bit lines and the sense nodes; a latch circuit latching a first high level potential to one of the pair of sense nodes, and latching a low level potential to the other sense node of the pair of sense nodes; and a level shifter applying a second high level potential higher than the first high level potential to one of the pair of bit lines according to the potentials latched to the pair of sense nodes during a data write operation or a data write-back operation.

17 Claims, 5 Drawing Sheets

SEMICONDUCTOR MEMORY DEVICE

CROSS-REFERENCE TO RELATED APPLICATIONS

This application is based upon and claims the benefit of priority from the prior Japanese Patent Applications No. 2007-42190, filed on Feb. 22, 2007, the entire contents of which are incorporated herein by reference.

BACKGROUND OF THE INVENTION

1. Field of the Invention

The present invention relates to a semiconductor memory device, and more particularly to, for example, a semiconductor memory device for storing data in each memory cell according to the number of majority carriers accumulated in a floating body of the memory cell.

2. Related Art

In recent years, there has been known an FBC (Floating Body Cell) memory device as a semiconductor memory device expected to replace a DRAM. The FBC memory device includes NMOS transistors each including a floating body (hereinafter, also "body region" or "body") on an SOI (Silicon On Insulator) substrate. The FBC memory device stores data "1" or "0" in each memory cell according to the number of majority carriers accumulated in the body region.

For example, it is defined that a state in which the number of holes accumulated in the body region is large is data "1" and that a state in which the number of holes accumulated in the body region is small is data "0". In this case, a threshold voltage of a memory cell storing therein data "1" (hereinafter, also ""1" cell") is lower than that of a memory cell storing therein data "0" (hereinafter, also ""0" cell"). Due to this, if data is read from memory cells, a potential of a bit line connected to the "1" cell is lower than that of a bit line connected to the "0" cell. Accordingly, to write back the same data as the read data to each memory cell, a sense amplifier needs to apply a potential corresponding to the data, logic of which is inverted with respect to logic of the read data, to the memory cell. To this end, in the conventional FBC memory device, each sense amplifier needs to include not only a latch circuit holding the read data in a sense node but also a transfer gate connecting the sense node to a bit line other than the bit line connected to the memory cell in a data read operation.

However, at the time of writing back the data to each memory cell, a power supply voltage for writing data is transmitted to the bit lines via the transfer gate and transistors constituting the latch circuit. The transistors and the transfer gate disadvantageously cause a power supply voltage to drop. As a result, sufficient current to write the data to the memory cell cannot be applied to the bit lines or time for writing the data is lengthened. This may possibly cause a data writing error. Conventionally, to suppress such a voltage drop, it is disadvantageously necessary to design sizes (W(channel width)/L(channel length) of each of the transistors constituting the latch circuit and the transfer gate to be made large.

Moreover, if data is to be read or written, the latch circuit needs to also drive a DQ line connecting a DQ buffer temporarily storing therein the read or write data to the sense amplifier. This requires the sizes (W/L) of the transistors of the latch circuit to be sufficiently large. If the size is small, read or write time is eventually made long. If the sizes (W/L) of the transistors of the latch circuit and the transfer gate are large, the circuit scale of the sense amplifier is made large. Each sense amplifier is provided to correspond to paired bit lines. Due to this, if each sense amplifier is large in circuit scale, this disadvantageously makes the overall FBC memory device large in size.

Furthermore, a potential difference between a pair of sense nodes (hereinafter, also "paired sense nodes") latching data corresponds to a difference between a bit line potential (VBLH) for writing data "1" and a bit line potential (VBLL) for writing data "0". In a data refresh operation, it is normally necessary to write back data only to "0" cells. However, each of the sense amplifiers in the conventional FBC memory device writes back data not only to the "0" cells but also to the "1" cells. This disadvantageously increases current consumption.

SUMMARY OF THE INVENTION

A semiconductor memory device according to an embodiment of the present invention comprises memory cells including a floating body in an electrically floating state, and storing therein data according to number of carriers accumulated in the floating body; word lines connected to gates of the memory cells; a pair of bit lines connected to the memory cells, and transmitting data of the memory cells; a pair of sense nodes connected to the pair of bit lines, and transmitting the data of the memory cells; a plurality of transfer gates connected between the pair of bit lines and the pair of sense nodes; a latch circuit latching a first high level potential to one of the pair of sense nodes, and latching a low level potential to the other sense node of the pair of sense nodes; and a level shifter applying a second high level potential higher than the first high level potential to one of the pair of bit lines according to the potentials latched to the pair of sense nodes during a data write operation or a data write-back operation.

DETAILED DESCRIPTION OF THE INVENTION

Embodiments of the present invention will be explained below in detail with reference to the accompanying drawings. Note that the invention is not limited thereto.

Figure 1:
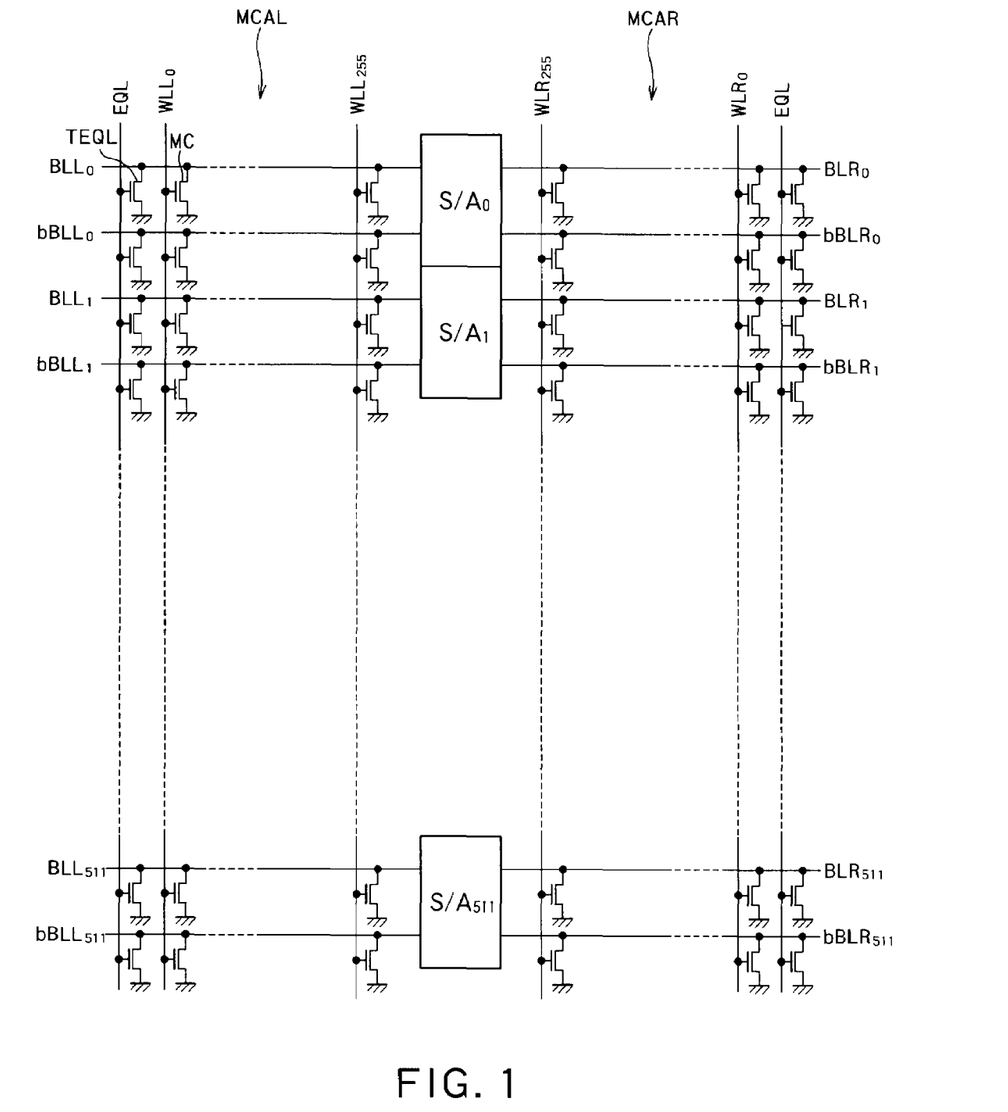
FIG. 1 is a circuit diagram showing a configuration of an FBC memory device according to an embodiment of the present invention.

FIG. 1 is a circuit diagram showing a configuration of an FBC memory device according to an embodiment of the present invention. The FBC memory device includes memory cells MCs, sense amplifiers S/Ai (where i is an integer) (hereinafter, also "S/As"), word lines WLLi and WLRi (hereinafter, also "WLLs and WLRs"), bit lines BLLi and BLRi (hereinafter, also "BLLs and BLRs"), bit lines bBLLi and bBLRi (hereinafter, also "bBLLs and bBLRs"), equalizing lines EQLs, and equalizing transistors TEQL and TEQR (hereinafter, also "TEQs").

The FBC memory device according to the embodiment has a two cells/bit structure. The "two cells/bit structure" is a structure in which one bit data is stored by writing data having reverse polarities to two memory cells MCs which are connected to a pair of bit lines BLL and bBLL or BLR and bBLR, respectively and which are adjacent to each other on the same word line. The "data having reverse polarities" means that two data have a complementarity relation such as a relation between data "0" and "1". To read data, one of the data having reverse polarities is set as a reference data for the other data and the other is set as a reference data for one data. Accordingly, each pair of bit lines BLL and bBLL or BLR and bBLR transmit data having reverse polarities with respect to each other. As a result, the corresponding sense amplifier S/A detects that data is "1" or "0" according to a difference in current carried across a pair of sense nodes SN and bSN to be described later.

The memory cells MCs are arranged in a matrix and constitute memory cell arrays MCAL and MCAR (hereinafter, also "MCAs"). The word lines WLLs and WLRs extend in a row direction and are connected to gates of the memory cells MCs. In the present embodiment, 256 word lines WLLs and 256 word lines WLRs are arranged on the left and right of the sense amplifiers S/As, respectively. In FIG. 1, the 256 word lines WLLs and the 256 word lines WLRs are denoted by WLL0 to WLL255 and WLR0 to WLR255, respectively. The bit lines BLLs and BLRs extend in a column direction and are connected to sources or drains of the memory cells MCs. In the present embodiment, 512 bit lines BLLs and 512 bit lines BLRs are arranged on the left and right of the sense amplifiers S/As, respectively. In FIG. 1, the 512 bit lines BLLs and the 512 bit lines BLRs are denoted by BLL0 to BLL511 and BLR0 to BLR511, respectively. The word lines WLLs and WLRs and the bit lines BLLs and BLRs are orthogonal to one another and the memory cells MCs are provided at respective cross points.

Each of the equalizing line EQL is connected to gates of the equalizing transistors TEQs. Each of the equalizing transistors TEQs is connected between one bit line BLL or BLR and a ground. By connecting the bit line BLL or BLR to the ground, each equalizing transistor TEQ equalizes a potential of the bit line BLL or BLR to a ground potential.

Figure 2:
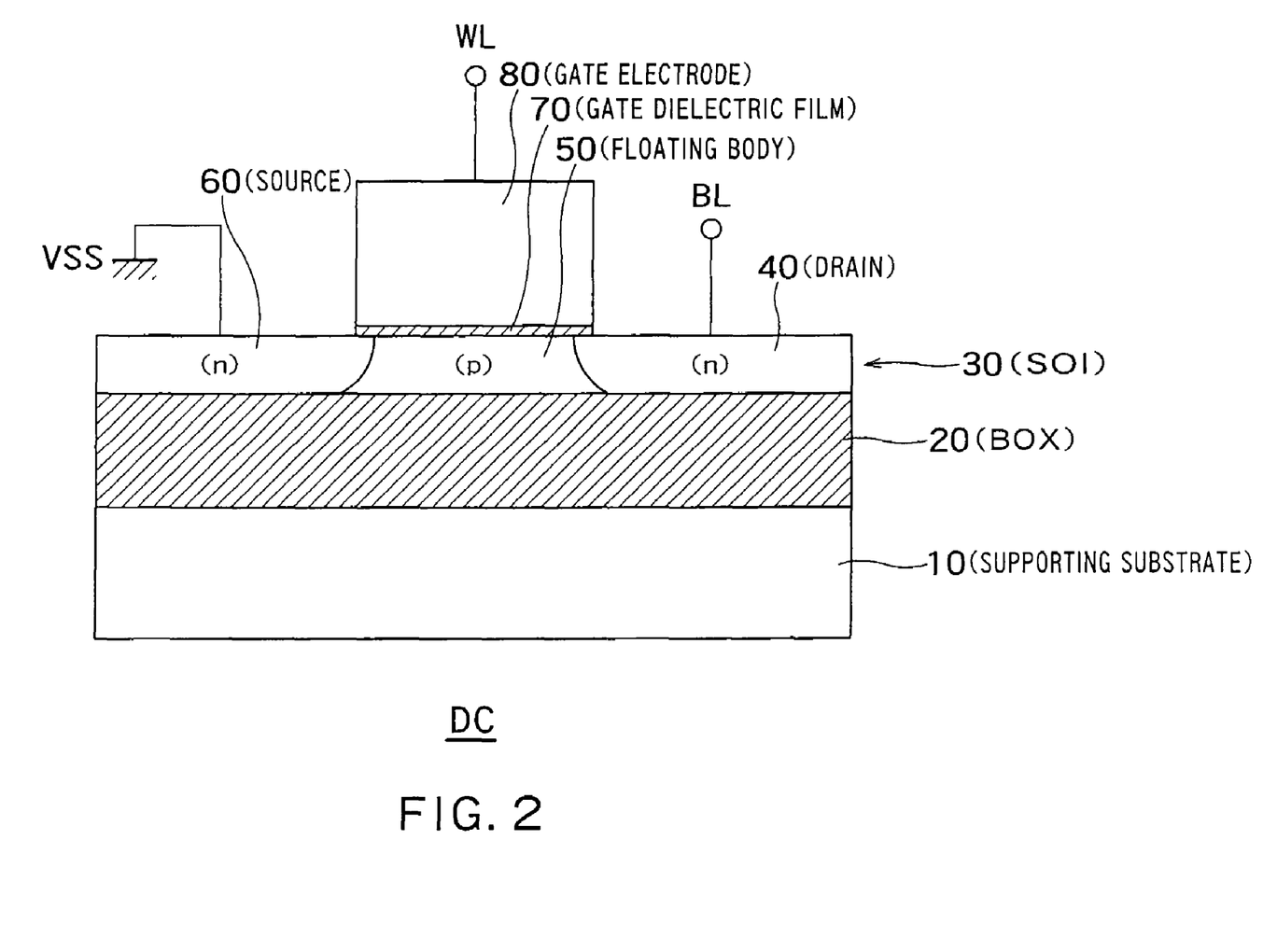
FIG. 2 is a cross-sectional view showing a structure of each memory cell MC.

FIG. 2 is a cross-sectional view showing a structure of each memory cell MC. The memory cell MC is provided on an SOI substrate including a supporting substrate 10, a BOX layer 20, and an SOI layer 30. A source 60 and a drain 40 are provided in the SOI layer 30. A floating body (hereinafter, also "body" or "body region") 50 is a semiconductor opposite in conduction type to the source 60 and the drain 40. The floating body 50 is in an electrically floating state by being surrounded by the source 60, the drain 40, the BOX layer 20, a gate dielectric film 70, and an STI (Shallow Trench Isolation) (not shown). The FBC memory device can store data in each memory cell MC according to the number of majority carriers accumulated in the floating body 50 of the memory cell MC.

In the present embodiment, the memory cells MCs are N-type MISFET. It is defined that a state in which the number of holes accumulated in the body 50 is large is data "1" and that a state in which the number of holes accumulated in the body 50 is small is data "0".

A data write operation will be described. To write data "1" to one memory cell MC, the memory cell MC is caused to operate in a saturation state. For example, a potential of the word line WL connected to the memory cell MC is biased to 1.5 volts (V) and that of the bit line BL connected to the memory cell MC is biased to 1.5 V. A potential of the source 60 is set to GND (0 V). By doing so, impact ionization occurs near the drain 40 to thereby generate many pairs of electrons and holes. The electrons generated by the impact ionization flow into the drain 40 whereas the holes generated by the impact ionization are accumulated in the body 50 having a low potential. If a balance is attained between a current carried when the holes are generated by the impact ionization and a forward current at a pn junction between the body 50 and the source 60, a voltage of the body 50 ("body voltage") turns into an equilibrium state. The body voltage is about 0.7 V, for example.

To write data "0", the potential of the bit line BL is reduced to negative voltage which is lower potentials than a potential of sources of the memory cells. For example, the potential of the bit line BL is reduced to −1.5 V. By doing so, a pn junction between the body 50 and the drain 40 is biased largely in forward direction. The holes accumulated in the body 50 are discharged to the drain 40 and the data "0" is stored in the memory cell MC.

A data read operation will be described. In the data read operation, the word line WL connected to one memory cell MC is activated similarly to the data write operation but the potential of the bit line BL connected to the memory cell MC is set lower than that when the data "1" is written to the memory cell MC. For example, the potential of the word line WL is set to 1.5 V and that of the bit line BL is set to 0.2 V. The memory cell MC is caused to operate in a linear region. The memory cell MC storing therein data "0" and the memory cell MC storing therein data "1" differ in a threshold voltage of the memory cell MC because of the difference in the number of holes accumulated in the body 50. By detecting the difference in the threshold voltage, it is discriminated whether the data is "1" or "0". The reason for setting the voltage of the bit line BL low in the data read operation is as follows. If the voltage of the bit line BL is set high to bias the memory cell MC to the saturation state, the data "0" is changed to the data "1" by the impact ionization when the data "0" is read.

Figure 3:
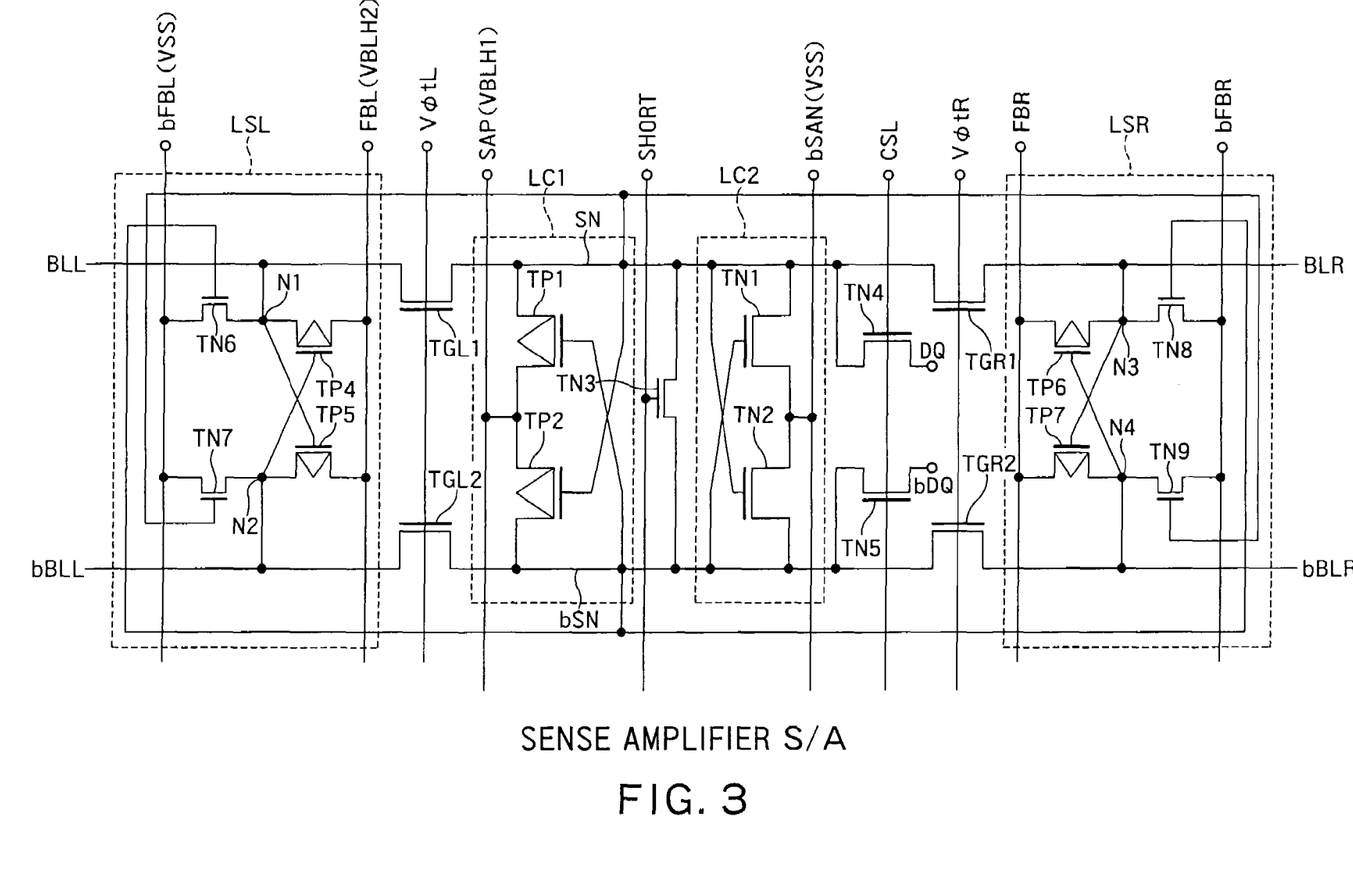
FIG. 3 is a circuit diagram showing a configuration of each sense amplifier S/A.

FIG. 3 is a circuit diagram showing a configuration of each sense amplifier S/A. The sense amplifier S/A is connected to the paired bit lines BLL and bBLL and the paired bit lines BLR and bBLR provided on the left and right of the sense amplifier S/A, respectively, and is provided to correspond to two pairs of bit lines BLL, bBLL and BLR, bBLR. In an actual data read or write operation, the sense amplifier S/A receives data from one pair of bit lines out of the two pairs of bit lines or transmit data to the paired bit lines. At this time, the other paired bit lines are disconnected from a pair of sense nodes SN and bSN by transfer gates TGLs or TGRs.

The sense amplifier S/A includes a pair of sense nodes SN and bSN. The sense node SN is connected to the bit line BLL corresponding to the sense amplifier S/A via a transfer gate TGL1, and connected to the bit line BLR corresponding to the sense amplifier S/A via a transfer gate TGR1. The sense node bSN is connected to the bit line bBLL corresponding to the sense amplifier S/A via a transfer gate TGL2, and connected to the bit line bBLR corresponding to the sense amplifier S/A via a transfer gate TGR2. Each of the transfer gates TGL1, TGL2, TGR1, and TGR2 is constituted by an N-type FET.

The transfer gates TGL1 and TGL2 are connected between the sense node SN and the bit line BLL and between the sense node bSN and the bit line bBLL, respectively, and controlled to be turned on or off by a signal ΦtL. The transfer gates TGR1 and TGR2 are connected between the sense node SN and the bit line BLR and between the sense node bSN and the bit line bBLR, respectively, and controlled to be turned on or off by a signal ΦtR. In the data read or write operation, one of the signals ΦtL and ΦtR is activated and the other signal is deactivated.

The "activate" means to turn on or drive an element or a circuit and "deactivate" means to turn off or stop the element or the circuit. Accordingly, a HIGH (high potential level) signal is sometimes an active signal and a LOW (low potential level) signal is sometimes an active signal. For example, an NMOS transistor is activated by setting a gate of the NMOS transistor HIGH. A PMOS transistor is activated by setting a gate of the PMOS transistor LOW.

The sense amplifier S/A also includes cross-coupled dynamic latch circuits (hereinafter, "latch circuits") LC1 and LC2. The latch circuit LC1 is configured to include two P-type transistors TP1 and TP2 connected in series between the sense nodes SN and bSN. A gate of the transistor TP1 is connected to the sense node bSN and that of the transistor TP2 is connected to the sense node SN. Namely, the gates of the respective transistors TP1 and TP2 are cross-coupled to the sense nodes SN and bSN. The latch circuit LC2 is configured to include two N-type transistors TN1 and TN2 connected in series between the sense nodes SN and bSN. A gate of the transistor TN1 is connected to the sense node bSN and that of the transistor TN2 is connected to the sense node SN. Namely, the gates of the respective transistors TN1 and TN2 are cross-coupled to the sense nodes SN and bSN. The latch circuits LC1 and LC2 are driven by activating signals SAP and bSAN, respectively. Each of the latch circuits LC1 and LC2 amplifies a potential difference between the paired sense nodes SN and bSN and latches data corresponding to the amplified potential difference.

An N-type transistor TN3 serving as a short-circuiting switch is connected between the sense nodes SN and bSN and controlled by a signal SHORT. The transistor TN3 shorts the sense node SN to the sense node bSN before the data read or write operation, thereby equalizing the sense node SN to the sense node bSN.

An N-type transistor TN4 is connected between a DQ line and the sense node SN, and an N-type transistor TN5 is connected between a bDQ line and the sense node bSN. Gates of the respective transistors TN4 and TN5 are connected to a column selection line CSL. The DQ line and the bDQ line are connected to a DQ buffer (not shown). The DQ buffer temporarily stores therein data from each memory cell MC so as to output the data to an outside of the sense amplifier S/A in the data read operation, and temporarily stores therein data from the outside so as to transmit the data to the sense amplifier S/A in the data write operation. Accordingly, the column selection line CSL is activated when the data is read out to the outside of the memory or when the data is written to the memory cell MC from the outside of the memory, thereby making it possible to connect the sense node SN or bSN to the DQ buffer.

The sense amplifier S/A includes feedback signal lines (hereinafter, simply "signal lines") FBL, FBR, bFBL, and bFBR activated when data is written or written back to each memory cell MC, and level shifters SLS and LSR. The signal lines FBL and FBR serve as first signal lines and supply a second high level potential VBLH2, when data is to be written to the memory cell MC. Namely, the signal lines FBL and FBR are signal lines used to write data "1". The high level potential VBLH2 supplied by the signal lines FBL and FBR is higher than a high level potential VBLH1 of a signal line SAP. For example, the potential VBLH2 is 2.5 V and the potential VBLH1 is 1.2 V. VBLH1 and VBLH2 are higher potentials than a potential of sources of the memory cells.

The signal lines bFBL and bFBR serve as second signal lines and supply a low level potential VSS, when data is to be written to the memory cell MC. Namely, the signal lines bFBL and bFBR are signal lines used to write data "0". The low level potential VSS supplied by the signal lines bFBL and bFBR can be set equal to a low level potential VSS of a signal line bSAN used during data detection (the potential VSS is, for example, 0 V).

The level shifter LSL includes P-transistors TP4, TP5 and N-transistors TN6, TN7. The transistors TP4 and TN6 are connected in series between the signal lines FBL and bFBL. A connection node N1 between the transistors TP4 and TN6 is connected to the bit line BLL that is one of the paired bit lines BLL and bBLL. A gate of the transistor TP4 is connected to a node N2 between the transistors TP5 and TN7. The node N2 is connected to the bit line bBLL that is the other bit line of the paired bit lines BLL and bBLL. In other words, the transistor TP4 serving as a first transistor is configured to be connected between the signal line FBL and the node N1 (bit line BLL), and to be able to connect the signal line FBL to the bit line BLL according to the potential of the bit line bBLL (node N2). The transistor TN6 serving as a third transistor is connected between the signal line bFBL and the node N1. A gate of the transistor TN6 is connected to the sense node bSN. Therefore, the transistor TN6 is configured to be able to connect the signal line bFBL to the bit line BLL according to the potential of the sense node bSN.

Likewise, the transistors TP5 and TN7 are connected in series between the signal lines FBL and bFBL. The connection node N2 between the transistors TP5 and TN7 is connected to the bit line bBLL that is the other bit line of the paired bit lines BLL and bBLL. A gate of the transistor TP5 is connected to the node N1. The node N1 is connected to the bit line BLL that is one of the paired bit lines BLL and bBLL. In other words, the transistor TP5 serving as a second transistor is configured to be connected between the signal line FBL and the node N2 (bit line bBLL), and to be able to connect the signal line FBL to the bit line bBLL according to the potential of the bit line BLL (node N1). The transistor TN7 serving as a fourth transistor is connected between the signal line bFBL and the node N2. A gate of the transistor TN7 is connected to the sense node SN. Therefore, the transistor TN7 is configured to be able to connect the signal line bFBL to the bit line bBLL according to the potential of the sense node SN. In this manner, the gates of the respective transistors TN6 and TN7 are cross-coupled to the nodes N1 and N2.

When data "1" is to be written to one memory cell MC via the bit line BLL, the high level potential VBLH2 of the signal line FBL is transmitted to the bit line BLL via the transistor TP4. When data "0" is to be written to the memory cell MC via the bit line BLL, the low level potential VSS of the signal line bFBL is transmitted to the bit line BLL via the transistor TN6. Likewise, when data "1" is to be written to the memory cell MC via the bit line bBLL, the high level potential VBLH2 of the signal line FBL is transmitted to the bit line bBLL via the transistor TP5. when data "0" is to be written to the memory cell MC via the bit line bBLL, the low level potential VSS of the signal line bFBL is transmitted to the bit line BLL via the transistor TN7.

As described above, in the present embodiment, in the data write or data write-back operation, the signal line FBL or bFBL is connected to the bit line BLL or bBLL via one transistor. Accordingly, it suffices that a size (W/L) of each of the transistors TP4, TP5, TN6, and TN7 is smaller than that of each of the transistors and the transfer gates of the conventional latch circuit. In the data write or data write-back operation, the transistors TP1, TP2, TN1, and TN2 included in the latch circuits LC1 and LC2 do not intervene between the signal line FBL or bFBL and the bit line BLL or bBLL. Accordingly, similarly to the transistors TP4, TP5, TN6, and TN7, it is possible to make a size (W/L) of each of the transistors TP1, TP2, TN1, and TN2 smaller than that of each of the transistors and the transfer gates of the conventional latch circuit.

Moreover, in the present embodiment, in the data write or data write-back operation, the level shifter LSL applies the second high level potential VBLH2 higher than the first high level potential VBLH1 to the bit line BLL or bBLL according to the potentials latched by the paired sense nodes SN and bSN. In this manner, in the embodiment, different potential differences can be applied to the paired bit lines and the paired sense nodes, respectively. Namely, a write voltage used to write data to each memory cell MC and a voltage used to detect and latch data can be set independently. This is because the level shifter LSL enables the transistors TP1 to TP3 and TN1 to TN5 for data detection and the power supply voltages (of the signal lines SAP and bSAN) to be separated from the transistors TP4 to TP7 and TN6 to TN9 for data write operation and from the power supply voltages (of the signal lines FBL and bFBL). Since the transistors TP1 to TP3 and TN1 to TN5 are separated from the transistors TP4 to TP7 and TN6 to TN9, it is possible to suppress a data write rate or data write-back rate from being decelerated even if the sizes (W/L) of the transistors TP1 to TP3 and TN1 to TN5 are small.

In the present embodiment, the potential difference (between the signal lines SAP and bSAN) used when the latch circuits LC1 and LC2 detect data is set smaller than the difference in potentials applied to the paired bit lies BLL and bBLL (i.e., potential difference between the signal lines FBL and bFBL) used when data is written. By so setting, each sense amplifier S/A can write or write back data "1" to each memory cell MC at sufficiently high voltage and low breakdown-voltage transistors can be used as the transistors provided between the sense nodes SN and bSN, respectively. Namely, breakdown-voltages of the transistors TP1 to TP3 and TN1 to TN5 provided on the sense node side relative to the transfer gate can be set lower than those of the transistors TP4 to TP7 and TN6 to TN9 provided on the bit line side relative to the transfer gate. Accordingly, gate dielectric films of the transistors TP1 to TP3 and TN1 to TN5 can be made thinner than those of the transistors TP4 to TP7 and TN6 to TN9. If the gate dielectric films are thin, the sizes (W/L) of the respective transistors can be made small.

The level shifter LSR is configured similarly to the level shifter LSL and operates for the paired bit lines BLR and bBLR similarly to the level shifter LSL. Therefore, a configuration and an operation of the level shifter LSR will not be described herein. It is to be noted that the transistors TP4, TP5, TN6, and TN7 of the level shifter LSL correspond to transistors TP6, TP7, TN8, and TN9 of the level shifter LSR, respectively, and that the nodes N1 and N2 of the level shifter LSL correspond to nodes N3 and N4 of the level shifter LSR, respectively.

Operations performed by the FBC memory device according to the present embodiment will be described next.

FIGS. 4A to 4F are timing charts showing the data write operation or the write-back operation during a write operation writing data from the external of the memory or during a read operation reading-out to the external of the memory.

Figure 4A:
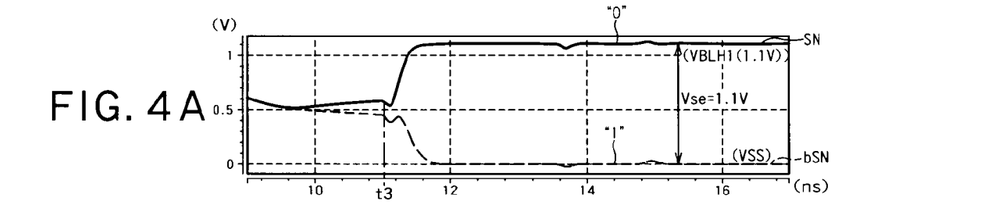
FIGS. 4A to 4F are timing charts showing the data write operation or the write-back operation during a write operation writing data from the external of the memory or during a read operation reading-out to the external of the memory.
Figure 4B:
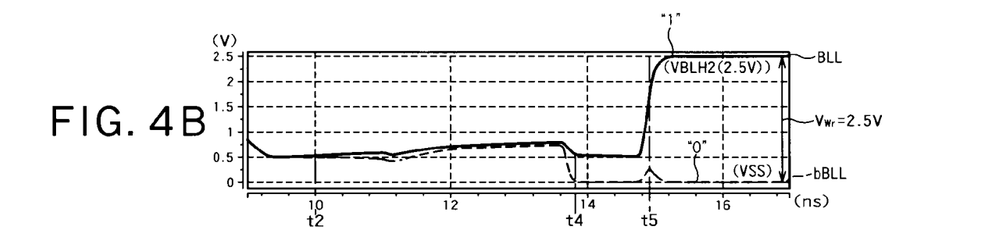
Figure 4C:
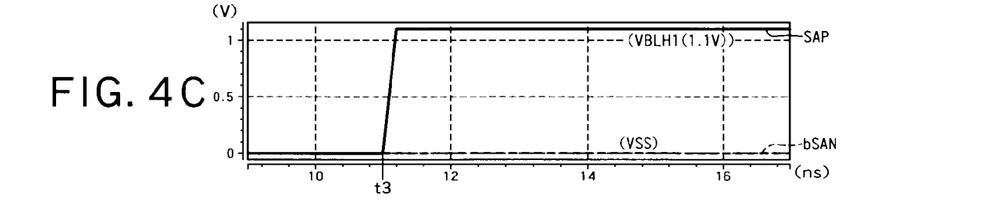
Figure 4D:
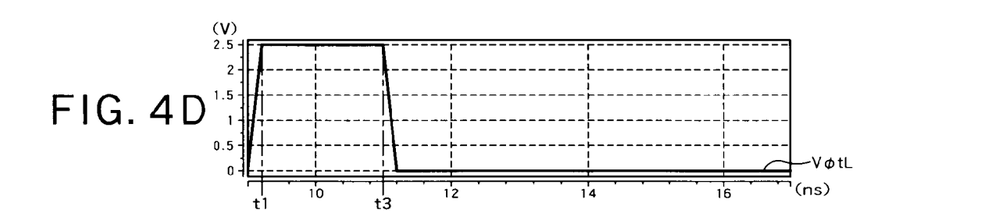
Figure 4E:
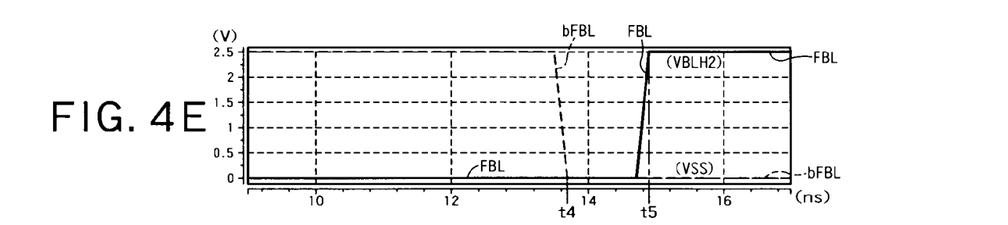
Figure 4F:
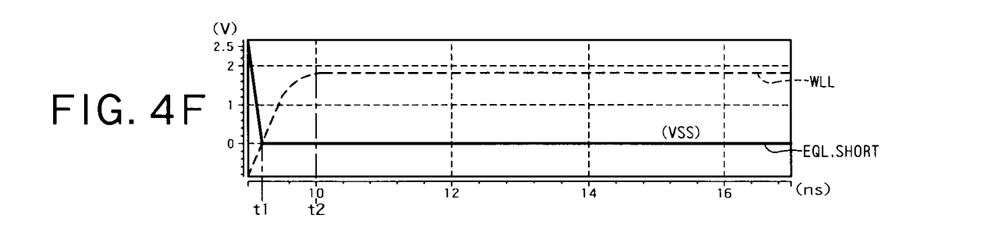

As shown in FIG. 4F, at a time point t1, a potential of a signal of the equalizing line EQL (hereinafter "signal EQL", which shall apply hereafter) is set to the low level potential VSS, thereby turning off the equalizing transistors TEQL and TEQR. The low level potential VSS is, for example, 0 V. As a result, the bit lines BLL and BLR shorted to the ground are all turned into high impedance states. At the same time, the signal SHORT is set to low level, thereby disconnecting the sense node SN from the sense node bSN. As a result, the bit lines BLLs in the memory cell array MCAL are separated from one another.

Initially, signals ΦtL and ΦtR are both inactive (at low level), so that the transfer gates TGL1, TGL2, TGR1, and TGR2 disconnect the paired sense nodes SN and bSN from the paired bit lines BLL and bBLL. While the signal ΦtR is kept inactive, the signal ΦtL is activated to high level as shown in FIG. 4D. By doing so, the transfer gates TGL1 and TGL2 connect the paired bit lines BLL and bBLL to the paired sense nodes SN and bSN. It is to be noted that the signal ΦtR is not shown because the signal ΦtR is kept low level.

As shown in FIG. 4C, a signal bSAN is kept low level (VSS). Therefore, the latch circuit LC2 shown in FIG. 3 can be driven by the potentials of the paired sense nodes SN and bSN. At the time point t1, a signal SAP is also at low level (VSS). Therefore, the latch circuit LC1 is inactive.

As shown in FIG. 4F, at a time point t2, one word line WLL is selectively activated. The memory cells MCs connected to the selected word line WLL are selected, accordingly. The latch circuit LC2 is connected to the low potential VSS and sources of the respective selected memory cells MCs are connected to a potential VSL. The potential VSL is, for example, 0.8 V and set higher than the low level potential VSS (e.g., 0 V). A potential difference between the VSS and the VSL is greater than threshold voltages of the transistors TN1 and TN2. Accordingly, the latch circuit LC2 is driven and current flows from the memory cells MCs into the latch circuit LC2. Namely, in the present embodiment, the latch circuit LC2 functions as a current load circuit.

The two adjacent memory cells MCs connected to the paired bit lines BLL and bBLL, respectively, store therein data having reverse polarities with respect to each other. Therefore, as shown in FIG. 4A, signals having reverse polarities are developed on the paired sense nodes SN and bSN, respectively. In the present embodiment, the sense node SN senses the data "0" and the sense node bSN senses the data "1".

In the present embodiment, the source potential VSL of each memory cell MC is higher than the power supply potential VSS of the latch circuit LC2. Therefore, the current flows from the memory cell MC into the latch circuit LC2. Accordingly, the potential difference between the sense nodes SN and bSN and that between the bit lines BLL and bBLL widen (develop) while falling from VSL to VSS.

At a time point (t3) at which a sufficient signal difference (potential difference) is generated between the paired sense nodes SN and bSN, the potential of the signal ΦTL is set to low level as shown in FIG. 4D, thereby disconnecting the paired sense nodes SN and bSN from the paired bit lines BLL and bBLL. At the same time, as shown in FIG. 4C, the signal SAP is activated to have the first high level potential VBLH1. The latch circuit LC1 is driven, accordingly. Further, as shown in FIG. 4A, the signal difference between the paired sense nodes SN and bSN is amplified. In the present embodiment, the potential of the sense node SN is VBLH1 (e.g., 1.1 V) and that of the sense node bSN is VSS (e.g., 0 V). A potential difference Vse between the sense nodes SN and bSN is, for example, 1.1 V. The latch circuits LC1 and LC2 hold the signal difference (potential difference) Vse in the sense nodes SN and bSN.

Next, the data write (write-back) operation is performed. As shown in FIG. 4E, at a time point t4, the signal line bFBL is activated to have a low level potential VBLL. The low level potential VBLL is a potential at which the data "0" is written to one memory cell MC and is, for example, 0 V. In the present embodiment, the potential VBLL is equal to the potential VSS. The transistor TN6 is thereby kept to be turned off but the transistor TN7 is turned on. The reason is as follows. The gate of the transistor TN6 is connected to the sense node bSN holding the low level potential VSS, and the gate of the transistor TN7 is connected to the sense node SN holding the high level potential VBLH1. By turning on the transistor TN7, the signal line bFBL is connected to the bit line bBLL via the node N2. As a result, the data "0" is written to the selected memory cells MCs connected to the selected word line WLL and the bit line bBLL.

Thereafter, as shown in FIG. 4E, at a time point t5, the signal line FBL is activated to have the second high level potential (VBLH2). At this time, a gate potential of the transistor TP4 is the low level potential (VSS), and the gate potential of the transistor TP5 is the first high level potential (VBLH1). Accordingly, only the transistor TP4 is turned on while the transistor TP5 is kept to be turned off. Therefore, the signal line FBL is connected to the bit line BLL via the node N1. As a result, the data "1" is written to the selected memory cells MCs connected to the selected word line WLL and the bit line BLL.

The second high level potential VBLH2 is higher than the first high level potential VBLH1 and is, for example, 2.5 V.

In the present embodiment, the potential of the bit line BLL in the data write operation or the data write-back operation is the second high level potential VBLH2 (e.g., 2.5 V) and that of the bit line bBLL is the low level potential VSS (e.g., 0 V). A potential difference Vwr between the bit lines BLL and bBLL at this time is, for example, 2.5 V.

The potential difference Vse (1.1 V) between the paired sense nodes SN and bSN during a data latch operation is smaller than the potential difference Vwr (2.5 V) between the bit lines BLL and bBLL during the data write or write-back operation. In this way, the potential VBLH2 is set so as to be higher than the potential VBLH1 and so that one of the transistors TN4 and TN5 is turned on and the other transistor is turned off in the data write or data write-back operation.

In the present embodiment, after the signal line bFBL is activated to have the low level potential VSS, the signal line FBL is activated to have the high level potential VBLH2. This is because the transistors TN6 and TN7 the gates of which are connected to the paired sense nodes SN and bSN are driven prior to the transistors TP4 and TP5 the gates of which are connected to the paired bit lines BLL and bBLL. It is thereby possible to correctly write data to the memory cells MCs connected to the bit lines BLL and bBLL. More specifically, as shown in FIG. 4B, at the time point t4, the potential of the bit line bBLL falls to the potential VSS. As a result, the potential difference is generated between the bit lines BLL and bBLL to some extent. Thereafter, the signal FBL is activated at the time point t5, thereby driving the cross-coupled transistors TP4 and TP5. The potential difference between the bit lines BLL and bBLL thereby increases. As a result, it is possible to correctly write data to the memory cells MCs connected to the bit lines BLL and bBLL. If the signal line FBL is activated before the signal line bFBL is activated, the signal difference (potential difference) between the paired bit lines BLL and bBLL at the time of data detection is small. Due to this, the transistors TP4 and TP5 may possibly write data having reverse logics to the bit line BLL or bBLL.

While the data read operation and the data write (data write-back) operations performed by the FBC memory device or particularly the paired bit lines BLL and bBLL and the level shifter LSL have been described above, the same thing is true for the data read operation to the external of the memory and the data write operation from the external of the memory performed by the paired bit lines BLR and bBLR and the level shifter LSR. Since the operations performed by the paired bit lines BLR and bBLR and the level shifter LSR can be easily speculated from the above description, they will not be described herein.

Moreover, in the operation for reading data to the outside of each sense amplifier S/A, the column selection line CSL is activated and the DQ line is driven. Even if this operation is performed simultaneously with an operation for restoring data "1", excessive current is not carried to the latch circuit LC1.

In the data read operation for reading data to the external of the memory, each sense amplifier S/A detects data and then reads the data to the outside of the sense amplifier S/A via the DQ line. At the same time, the sense amplifier S/A performs the operation for writing back the detected data to each memory cell MC. In the data write operation for writing data from the external of the memory, the sense amplifier S/A temporarily detects data stored in each memory cell MC, updates the detected data to data from the outside, and writes the updated data to the memory cell MC. Accordingly, the operation shown in FIGS. 4A to 4F can be used for both the operation for reading data to the outside and the operation for writing data from the outside.

FIGS. 5A to 5F are timing charts showing the refresh operation. The "refresh operation" means an operation for temporarily latching read data to the paired sense nodes SA and bSA and writing back (restoring) data having identical logic to the latched data to the memory cells MC. The refresh operation can suppress a change of data from "1" to "0" due to a charge pumping phenomenon and suppress a change of data from "0" to "1" due to leakage current or GIDL.

The charge pumping phenomenon is described below. When a memory cell is set in an ON-state, electrons in an inversion layer are partially trapped by interface states on an interface between a gate oxide film and a body region. Holes accumulated in the body region recombine with the electrons and disappear. Generally, if a word line is activated, data is not written back to unselected memory cells. Due to this, if the unselected memory cells are repeatedly turned on and off during the reading or writing of data from or to the selected memory cells, the number of holes accumulated in the body region of each of the unselected memory cells storing therein data "1" gradually decreases. As a result, the state of each unselected memory cell changes from the data "1" to the data "0". This phenomenon is called "charge pumping phenomenon".

The refresh operation according to the present embodiment shown in FIGS. 5A to 5F differs from the operations shown in FIGS. 4A to 4F in that the high level potential used to write back the data "1" is the potential VBLH1. The other potentials and the other operations in the refresh operation can be similar to those in the operations shown in FIGS. 4A to 4F. Therefore, only the difference between the refresh operation and the ordinary data read operation or data write operation will be described herein.

Figure 5A:
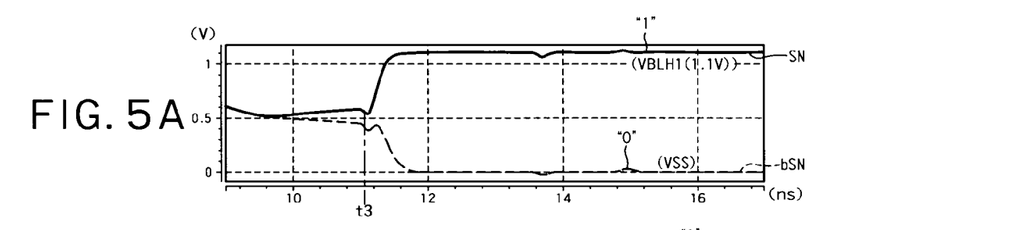
FIGS. 5A to 5F are timing charts showing the refresh operation.
Figure 5B:
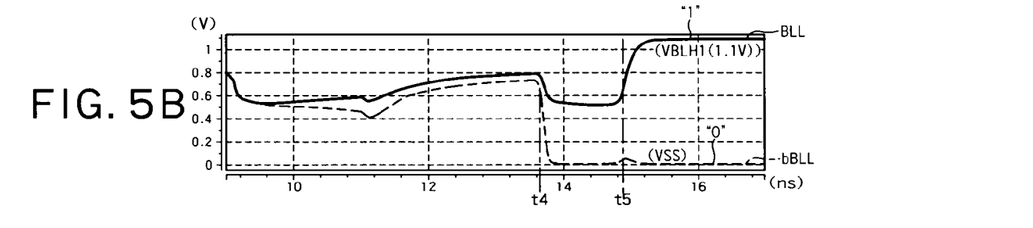
Figure 5C:
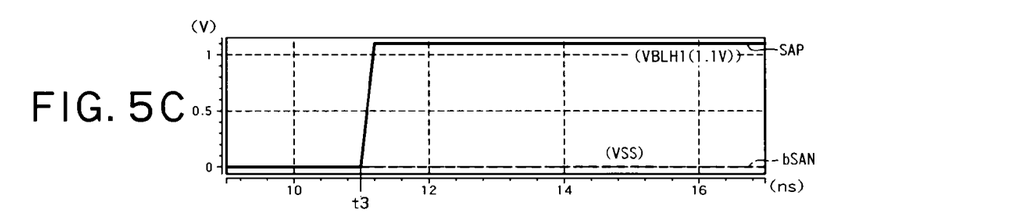
Figure 5D:
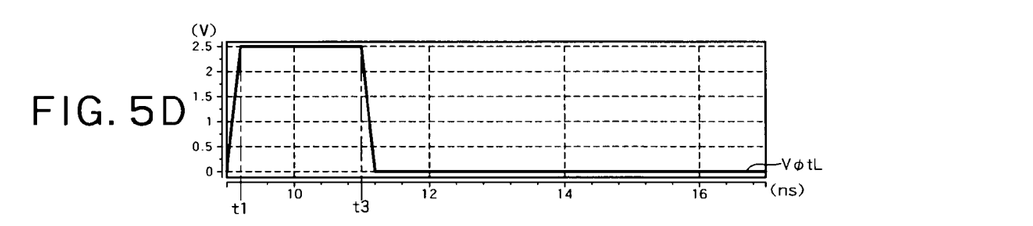
Figure 5E:
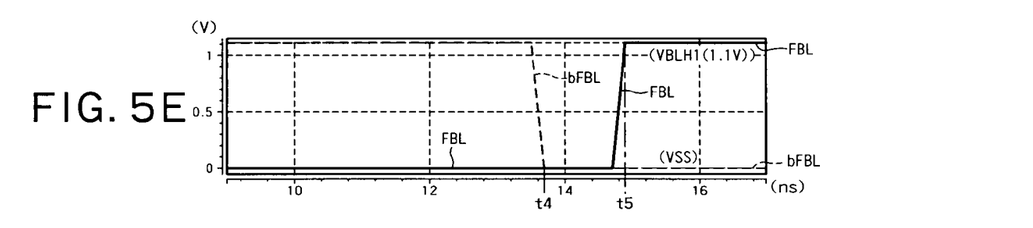
Figure 5F:
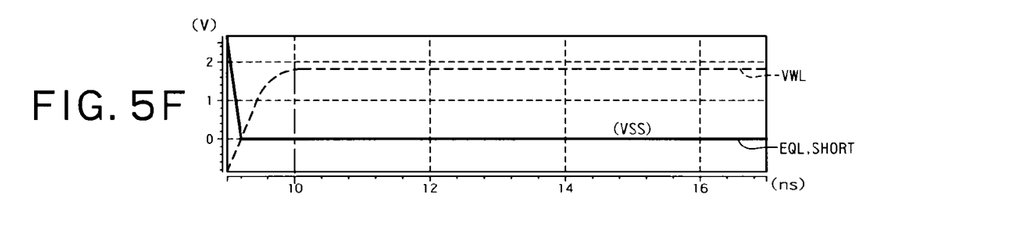

As shown in FIG. 5E, the high level potential of each of the feedback signal lines FBL and bFBL is the first high potential VBLH1. As a result, as shown in FIG. 5B, when the data "1" is written back (restored) to each memory cell MC (after the time point t5), the potential of the corresponding bit line BLL is equal to the first high potential VBLH1 (1.1 V) lower than the second high potential VBLH2 (2.5 V). Namely, the level shifter LSL applies the first high level potential VBLH1 to the bit line BLL when data is written back in the refresh operation.

The refresh operation for the data "1" is executed to deal with the charge pumping phenomenon differently from the data write operation for the data "1". Due to this, it suffices that the refresh operation for the data "1" can generate holes enough to refill the holes disappearing by the charge pumping phenomenon. Accordingly, the high potential VBLH2 used to write the data "1" is an excessively high potential for the refresh operation for the data "1". It suffices that the refresh operation for the data "1" applies the potential VBLH1 lower than the potential VBLH2 to the bit line BLL. The potential VBLH1 is the high level potential used to hold the data "1" in the sense node SN or bSN. The use of the potential VBLH2 for the refresh operation for the data "1" may possibly cause an increase in power consumption.

While the refresh operation performed by the FBC memory device with respect to the paired bit lines BLL and bBLL and the level shifter LSL has been described, the same thing is true for the refresh operation performed by the FBC memory device with respect to the paired bit lines BLR and bBLR and the level shifter LSR. Since the refresh operation performed by the FBC memory device with respect to the paired bit lines BLR and bBLR and the level shifter LSR can be easily speculated from the above-stated description, it will not be described herein.

In the present embodiment, each sense amplifier S/A is normally formed on the SOI substrate similarly to each memory cell MC. In this case, bodies of the respective transistors TN1 to TN9, TP1 to TP7, TGL1, TGL2, TGR1, and TGR2 are in floating states. The transistors TP1, TP2, TN1, and TN2 and the transfer gates TGL1, TGL2, TGR1, and TGR2 related to data detection (initial sensing) are susceptible to threshold fluctuations. Due to this, it is necessary to form a body contact (not shown), to fix a potential of the body to a predetermined potential, and to thereby stabilize the threshold voltage of the body in each of these transistors TP1, TP2, TN1, and TN2 and transfer gates TGL1, TGL2, TGR1, and TGR2. On the other hand, the transistors TP4 to TP7 and TN4 to TN9 unrelated to the data detection are not so susceptible to the threshold fluctuations. Due to this, it is preferable not to provide a body contact (not shown) in each of these transistors TP4 to TP7 and TN4 to TN9 with views of improving a current driving capability and reducing a chip area. It is thereby possible to detect data at high rate with high accuracy and to reduce a mounting area.

A conduction type of each of the transistors and transfer gates constituting each of the sense amplifiers S/As according to the present embodiment can be logically opposite to that described above. Namely, the P-type transistors TP1 to TP7 can be replaced by N-type transistors and the N-type transistors TN1 to TN9, TGL1, TGL2, TGR1, and TGR2 can be replaced by P-type transistors in each sense amplifier S/A, respectively. In this alternative, potential levels of control signals for these transistors and transfer gates are also logically inverted from those described above.

Moreover, the NMOS memory cells MCs can be replaced by PMOS memory cells. In this alternative, it is necessary to logically invert power supply potential levels (VBLH1, VBLH2, and VSS). For example, if the memory cells MCs are PMOS memory cells, then the low level potential VSS can be replaced by the high level potential VBLH and the high level potentials VBLH1 and VBLH2 can be replaced by low level potentials VSS1 and VSS2 (where |VSS2|≧|VSS1|), respectively. VSS1 and VSS2 are lower potentials than a potential of sources of the memory cells.

The invention claimed is:

1. A semiconductor memory device comprising:
   memory cells including floating bodies in electrically floating states, and storing therein data according to number of carriers accumulated in the floating bodies;
   word lines connected to gates of the memory cells;
   a pair of bit lines connected to the memory cells, and transmitting data of the memory cells;
   a pair of sense nodes connected to the pair of bit lines, and transmitting the data of the memory cells;
   a plurality of transfer gates connected between the pair of bit lines and the pair of sense nodes;
   a latch circuit latching a first high level potential to one of the pair of sense nodes, and latching a low level potential to the other sense node of the pair of sense nodes; and
   a level shifter applying a second high level potential higher than the first high level potential to one of the pair of bit lines according to the potentials latched to the pair of sense nodes during a data write operation or a data write-back operation, wherein
   the pair of bit lines transmit data complementary to each other.

2. The semiconductor memory device according to claim 1, wherein the level shifter includes:
   a first transistor of a first conduction type connected between a first signal line supplying the second high level potential during the data write operation or the data write-back operation and a first bit line of the pair of bit lines, a gate of the first transistor being connected to a second bit line of the pair of bit lines;
   a second transistor of the first conduction type connected between the first signal line and the second bit line, a gate of the second transistor being connected to the first bit line;
   a third transistor of a second conduction type connected between a second signal line supplying the low level potential during the data write operation or the data write-back operation and the first bit line, a gate of the third transistor being connected to one of the pair of sense nodes corresponding to the second bit line; and
   a fourth transistor of the second conduction type connected between the second signal line and the second bit line, a gate of the fourth transistor being connected to the other of the pair of sense nodes corresponding to the first bit line.

3. The semiconductor memory device according to claim 2, wherein during the data write operation or the data write-back operation, the second signal line is activated to have the low level potential, and then the first signal line is activated to have the second high level potential.

4. The semiconductor memory device according to claim 2, wherein during the data write-back operation in a refresh operation for writing back the data read from the memory cell to the memory cell, the level shifter applies the first high level potential to one of the paired bit lines.

5. The semiconductor memory device according to claim 2, wherein the latch circuit is configured to include a plurality of transistors including gate dielectric films thinner than gate dielectric films of the first to fourth transistors.

6. The semiconductor memory device according to claim 2, wherein the pair of bit lines transmit data complementary to each other.

7. The semiconductor memory device according to claim 2, wherein the third transistor connects the second signal line to the first bit line according to the potential of the sense node corresponding to the second bit line.

8. The semiconductor memory device according to claim 7, wherein the fourth transistor connects the second signal line to the second bit line according to the potential of the sense node corresponding to the first bit line.

9. The semiconductor memory device according to claim 8, wherein the first transistor connects the first signal line to the first bit line according to the potential of the sense node corresponding to the second bit line.

10. The semiconductor memory device according to claim 9, wherein the second transistor connects the first signal line to the second bit line according to the potential of the sense node corresponding to the first bit line.

11. The semiconductor memory device according to claim 2, wherein the fourth transistor connects the second signal line to the second bit line according to the potential of the sense node corresponding to the first bit line.

12. The semiconductor memory device according to claim 2, wherein the first transistor connects the first signal line to the first bit line according to the potential of the sense node corresponding to the second bit line.

13. The semiconductor memory device according to claim 2, wherein the second transistor connects the first signal line to the second bit line according to the potential of the sense node corresponding to the first bit line.

14. The semiconductor memory device according to claim 1, wherein during the data write-back operation in a refresh operation for writing back the data read from the memory cell to the memory cell, the level shifter applies the first high level potential to one of the paired bit lines.

15. The semiconductor memory device according to claim 1, further comprising body contacts fixing body potentials of the plurality of transfer gates and body potentials of transistors constituting the latch circuit.

16. The driving method according to claim 1, wherein the memory cell is composed of an N-type MOSFET, and both the first high level potential and the second high level potential are higher potentials than a potential of sources of the memory cells.

17. A semiconductor memory device comprising:
memory cells including floating bodies in electrically floating states, and storing therein data according to number of carriers accumulated in the floating bodies;
word lines connected to gates of the memory cells;
a pair of bit lines connected to the memory cells, and transmitting data of the memory cells;
a pair of sense nodes connected to the pair of bit lines, and transmitting the data of the memory cells;
a plurality of transfer gates connected between the pair of bit lines and the pair of sense nodes;
a latch circuit latching a high level potential to one of the pair of sense nodes, and latching a first low level potential to the other sense node of the pair of sense nodes; and
a level shifter applying a second low level potential lower than the first low level potential to one of the pair of bit lines according to the potentials latched to the pair of sense nodes during a data write operation or a data write-back operation, wherein
the memory cell is composed of a P-type MOSFET, and both the first low level potential and the second low level potential are lower potentials than a potential of sources of the memory cells.

* * * * *